(12) United States Patent
Cho et al.

(10) Patent No.: US 11,864,476 B2
(45) Date of Patent: Jan. 2, 2024

(54) ELECTRONIC DEVICE

(71) Applicant: SK hynix Inc., Icheon (KR)

(72) Inventors: Byung Jick Cho, Icheon (KR); Yong Hun Sung, Icheon (KR); Ji Sun Han, Icheon (KR)

(73) Assignee: SK hynix Inc., Icheon (KR)

( * ) Notice: Subject to any disclaimer, the term of this patent is extended or adjusted under 35 U.S.C. 154(b) by 208 days.

(21) Appl. No.: 17/369,725

(22) Filed: Jul. 7, 2021

(65) Prior Publication Data
US 2022/0310916 A1  Sep. 29, 2022

(30) Foreign Application Priority Data
Mar. 24, 2021  (KR) .................. 10-2021-0038231

(51) Int. Cl.
*G11C 11/00* (2006.01)
*H10N 70/00* (2023.01)
*G06F 12/0831* (2016.01)
*H10B 63/00* (2023.01)

(52) U.S. Cl.
CPC ....... *H10N 70/841* (2023.02); *G06F 12/0831* (2013.01); *H10B 63/80* (2023.02); *H10N 70/883* (2023.02); *H10N 70/8845* (2023.02)

(58) Field of Classification Search
CPC .............. H10N 70/841; H10N 70/883; H10N 70/8845; H10B 63/80; G06F 12/0831
USPC ........................................................ 365/148
See application file for complete search history.

(56) References Cited

U.S. PATENT DOCUMENTS

| | | | | |
|---|---|---|---|---|
| 8,395,138 B2* | 3/2013 | Yamamoto | ........... | H10N 70/023 257/77 |
| 8,563,962 B2* | 10/2013 | Arita | ...................... | H10B 63/30 257/E47.001 |
| 9,299,929 B2 | 3/2016 | Gotti et al. | | |
| 9,842,882 B1* | 12/2017 | Kim | ................... | G11C 13/0069 |
| 10,861,503 B1* | 12/2020 | Kim | ....................... | H10B 63/24 |
| 11,349,068 B2* | 5/2022 | Zheng | ................... | H10N 70/841 |
| 2022/0263020 A1* | 8/2022 | Han | ....................... | H10N 70/821 |

* cited by examiner

*Primary Examiner* — Viet Q Nguyen

(57) ABSTRACT

An electronic device comprises a semiconductor memory that includes: a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer containing a lower concentration of nitrogen or containing no nitrogen.

16 Claims, 10 Drawing Sheets

ELECTRONIC DEVICE

CROSS-REFERENCE TO RELATED APPLICATION

This application claims priority under 35 U.S.C. § 119 to Korean Patent Application No. 10-2021-0038231 filed on Mar. 24, 2021, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of improving operating characteristics of a semiconductor memory and preventing process defects.

In an embodiment, an electronic device includes a semiconductor memory that includes: a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer.

In another embodiment, an electronic device includes a semiconductor memory that includes: a first line; a second line disposed over the first line to be spaced apart from the first line; a variable resistance layer disposed between the first line and the second line; a selection element layer disposed between the first line and the variable resistance layer or between the second line and the variable resistance layer; an electrode layer disposed under the second line to be adjacent to the second line; and a resistance layer disposed between the second line and the electrode layer, wherein the electrode layer includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the resistance layer.

DETAILED DESCRIPTION

Figure 1A:
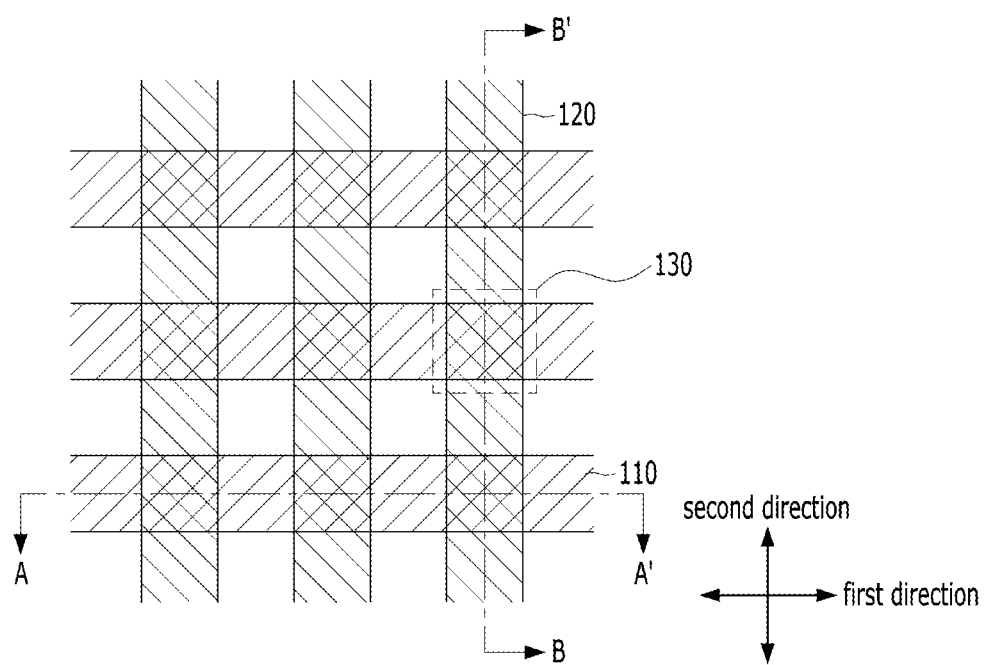
FIGS. 1A and 1B illustrate a semiconductor memory according to a first embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
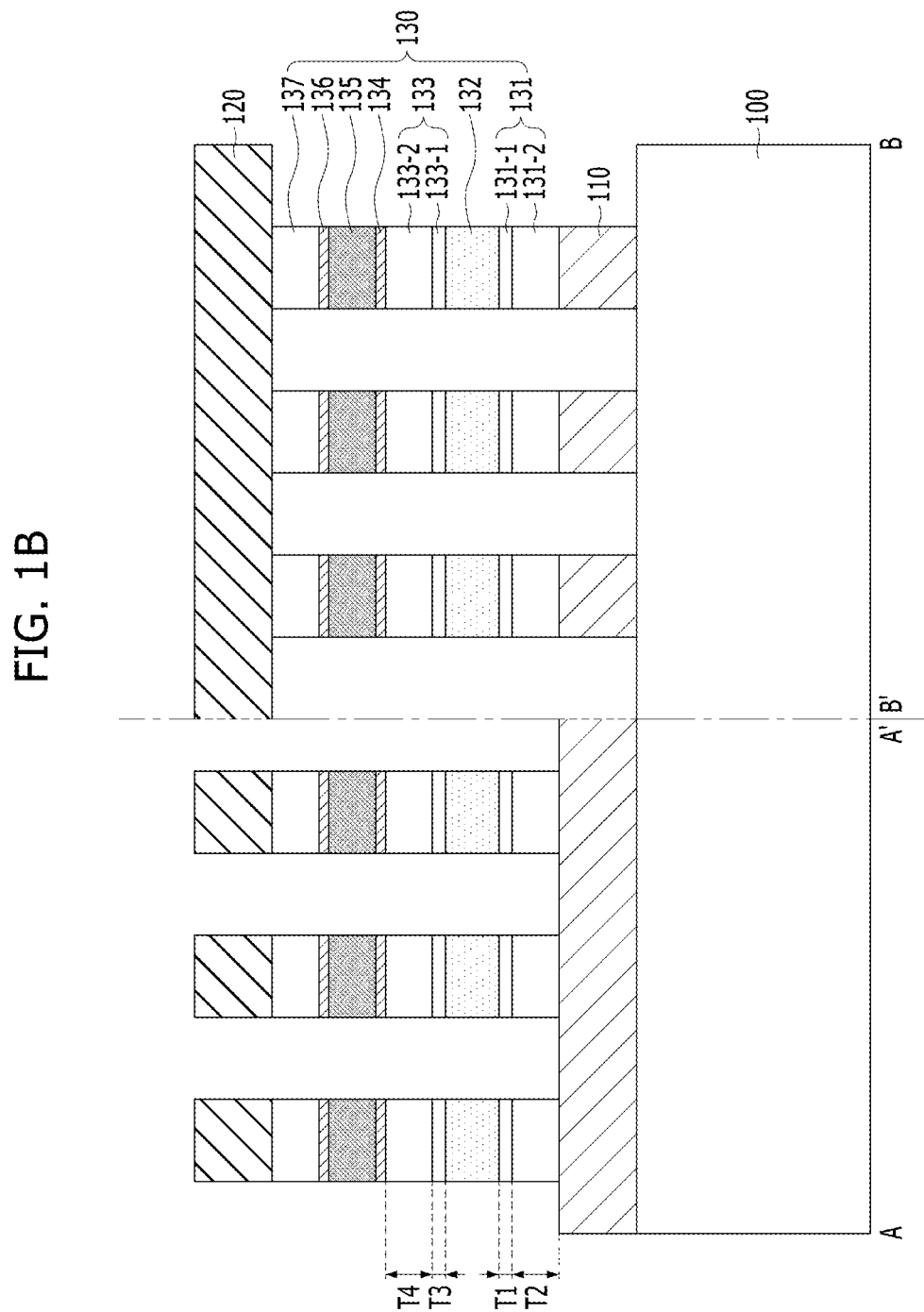

FIGS. 1A and 1B illustrate a semiconductor memory according to a first embodiment of the present disclosure. FIG. 1A is a plan view, and FIG. 1B is a cross-sectional view taken along lines A-A' and B-B' of FIG. 1A.

Referring to FIGS. 1A and 1B, the semiconductor memory may include a substrate 100, first lines 110 formed over the substrate 100 and extending in a first direction, second lines 120 formed over the first lines 110 to be spaced apart from the first lines 110 in a third direction and extending in a second direction crossing the first direction, and memory cells 130 disposed at intersections of the first lines 110 and the second lines 120 between the first lines 110 and the second lines 120 in the third direction that is perpendicular to the first and second directions.

The substrate 100 may include a semiconductor material such as silicon. A required lower structure (not shown) may be formed in the substrate 100. For example, the substrate 100 may include a driving circuit (not shown) electrically connected to the first lines 110 and/or the second lines 120 to control operations of the memory cells 130.

The first line 110 and the second line 120 may include one or more of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof, and may have a single-layered structure or a multi-layered structure. The first line 110 and the second line 120 may be connected to a lower end and an upper end of the memory cell 130, respectively, and may transmit a voltage or current to the memory cell 130 to drive the memory cell 130. When the first line 110 functions as a word line, the second line 120 may function as a bit line. Conversely, when the first line 110 functions as a bit line, the second line 120 may function as a word line.

The memory cell 130 may include a variable resistance element that stores different data by switching between different resistance states according to a voltage or current applied to the first line 110 and the second line 120. For example, as shown in the plan view of FIG. 1A, the memory cell 130 may have a rectangular shape in which both sidewalls in the first direction are aligned with the second line 120 and both sidewalls in the second direction are aligned with the first line 110. However, embodiments are not limited thereto. As long as the memory cell 130 overlaps the intersection of the first line 110 and the second line 120, a planar shape of the memory cell 130 may be variously modified.

The memory cell 130 may include a stacked structure of a lower electrode layer 131, a selection element layer 132, an intermediate electrode layer 133, a variable resistance layer 135, and an upper electrode layer 137. Further, the memory cell 130 may include a first interface electrode layer 134 interposed between the variable resistance layer 135 and the intermediate electrode layer 133, and a second interface electrode layer 136 interposed between the variable resistance layer 135 and the upper electrode layer 137.

The lower electrode layer 131 may be interposed between the first line 110 and the selection element layer 132, and may electrically connect the first line 110 and the selection element layer 132 to each other while physically separating the first line 110 and the selection element layer 132 from each other. In the present embodiment, the lower electrode layer 131 may include a stacked structure of a first lower electrode layer 131-1 and a second lower electrode layer 131-2. The second lower electrode layer 131-2 may include a carbon layer containing a relatively high concentration of nitrogen, and the first lower electrode layer 131-1 may include a carbon layer containing a relatively low concentration of nitrogen or containing no nitrogen. Therefore, the concentration of nitrogen in the carbon layer of the second lower electrode layer 131-2 is higher than the concentration of nitrogen in the carbon layer of the first lower electrode layer 131-1. Here, the carbon layer containing nitrogen may mean a layer including a carbon atom and a nitrogen atom, wherein a main atom is carbon and nitrogen is an additive element. The first lower electrode layer 131-1 may be interposed between the second lower electrode layer 131-2 and the selection element layer 132. Furthermore, a thickness T1 of the first lower electrode layer 131-1 may be smaller than a thickness T2 of the second lower electrode layer 131-2. Advantages of the present embodiment will be described in comparison with comparative examples.

In a first comparative example in which a single-layered carbon layer is used as a lower electrode layer, there is a problem in that a surface roughness of the lower electrode layer is poor. In this case, a layer formed on the lower electrode layer, for example, a selection element layer, may have a deteriorated film quality because of the poor surface roughness of the lower electrode layer, and thus an operating voltage may not be uniform during an operation of a memory cell.

In order to solve the problem of the first comparative example, a second comparative example in which a carbon layer used as a lower electrode layer is formed by using PVD (Physical Vapor Deposition) at a relatively low temperature may be considered. This is because the carbon layer deposited by the low-temperature PVD method has a reduced surface roughness compared to the carbon layer of the first comparative example. However, in the second comparative example, resistivity of the lower electrode layer may be greatly increased, and thus, it may be difficult to use the lower electrode layer as a component of a memory cell.

In order to solve the problems of the first and second comparative examples, a third comparative example in which a carbon layer doped with a high concentration of nitrogen is used as a lower electrode layer may be considered. This is because the carbon layer doped with a high concentration of nitrogen has a reduced surface roughness and a similar level of resistivity compared to the carbon layer of the first comparative example. However, in this case, an interface resistance may be increased due to the nitrogen doping at an interface between the lower electrode layer and a selection element layer. The increased the interface resistance may increase a threshold voltage for turning on the selection element layer, and as a result, an operating voltage of a memory cell may be increased.

On the other hand, in the present embodiment, by using a carbon layer containing a relatively high concentration of nitrogen as the second lower electrode layer 131-2 and interposing the first lower electrode layer 131-1, which includes a carbon layer containing a relatively low concentration of nitrogen or a carbon layer containing no nitrogen, between the selection element layer 132 and the second lower electrode layer 131-2, both a surface roughness problem of the lower electrode layer 131 and an increase in an interface resistance between the lower electrode layer 131 and the selection element layer 132 may be alleviated.

More specifically, when the carbon layer containing the relatively high concentration of nitrogen is used as the second lower electrode layer 131-2, a surface roughness of the second lower electrode layer 131-2 may be reduced. When the first lower electrode layer 131-1 is formed on the second lower electrode layer 131-2, the surface roughness of the second lower electrode layer 131-2 may be reflected to the first lower electrode layer 131-1, and thus, a surface roughness of the first lower electrode layer 131-1 may also be reduced. In particular, because the thickness T1 of the first lower electrode layer 131-1 is relatively thin, the surface roughness of the first lower electrode layer 131-1 may be further reduced. This is because a surface roughness of a carbon layer is proportional to a thickness thereof, regardless of whether nitrogen is doped or not and a concentration of nitrogen. That is, as the thickness of the carbon layer increases, the surface roughness thereof may increase, and as the thickness of the carbon layer decreases, the surface roughness thereof may decrease. As a result, the surface roughness of the lower electrode layer 131 may be reduced as the thickness of the carbon layer used as the first lower electrode layer 131-1 is reduced.

In addition, by interposing the first lower electrode layer 131-1 between the second lower electrode layer 131-2 and the selection element layer 132, an increase in the interface resistance between the lower electrode layer 131 and the selection element layer 132 may be suppressed. Furthermore, the first lower electrode layer 131-1 may prevent nitrogen of the second lower electrode layer 131-2 from diffusing into the selection element layer 132. The diffusion of nitrogen into the selection element layer 132 may affect a property of the selection element layer 132.

To reduce the surface roughness of the lower electrode layer 131, a nitrogen content of the second lower electrode layer 131-2 may be in a range of 3 at % to 10 at %. Because the first lower electrode layer 131-1 has a lower nitrogen content than the second lower electrode layer 131-2, the nitrogen content of the first lower electrode layer 131-1 may be in a range of 0 at % to 3 at %.

In addition, to reduce the surface roughness of the lower electrode layer 131 and prevent the diffusion of nitrogen to the selection element layer 132, the thickness T1 of the first lower electrode layer 131-1 may be in a range of 30 Å to 50 Å. When the first lower electrode layer 131-1 has a thickness of less than 30 Å, it may be difficult to block the diffusion of nitrogen from the second lower electrode layer 132-2 to the selection element layer 132. In addition, when the first lower electrode layer 131-1 has a thickness greater than 50 Å, the surface roughness of the first lower electrode layer 131-1 may increase, thereby increasing the surface roughness of the lower electrode layer 131.

The selection element layer 132 may prevent a current leakage between the memory cells 130 sharing the first line 110 or the second line 120. To this end, the selection element layer 132 may have a threshold switching characteristic for blocking or substantially limiting a current flowing through the memory cell 130 when a magnitude of an applied voltage is less than a predetermined threshold value and for allowing a current flowing through the memory cell 130 to abruptly increase when the magnitude of the applied voltage is equal to or greater than the threshold value. The selection element layer 132 may be implemented in a turn-on state or a turn-off state based on the threshold value. The selection element layer 132 may include a diode, an OTS (Ovonic Threshold Switching) material such as a chalcogenide material, an MIEC (Mixed Ionic Electronic Conducting) material such as a metal containing a chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The intermediate electrode layer 133 may be interposed between the selection element layer 132 and the variable resistance layer 135, and may electrically connect the selection element layer 132 and the variable resistance layer 135 to each other while physically separating the selection element layer 132 and the variable resistance layer 135 from each other. In the present embodiment, the intermediate electrode layer 133 may include a stacked structure of a first intermediate electrode layer 133-1 and a second intermediate electrode layer 133-2. The first intermediate electrode layer 133-1 may include a carbon layer containing a relatively low concentration of nitrogen or containing no nitrogen, and the second intermediate electrode layer 133-2 may include a carbon layer containing a relatively high concentration of nitrogen. Therefore, the concentration of nitrogen in the carbon layer of the second intermediate electrode layer 133-2 is higher than the concentration of nitrogen in the carbon layer of the first intermediate electrode layer 133-1. The first intermediate electrode layer 133-1 may be interposed between the second intermediate electrode layer 133-2 and the selection element layer 132. Furthermore, a thickness T3 of the first intermediate electrode layer 133-1 may be smaller than a thickness T4 of the second intermediate electrode layer 133-2.

According to the present embodiment, both a surface roughness problem of the intermediate electrode layer 133 and an increase in an interface resistance between the intermediate electrode layer 133 and the selection element layer 132 may be alleviated.

More specifically, because the thickness T3 of the first intermediate electrode layer 133-1 is relatively thin, the surface roughness of the first intermediate electrode layer 133-1 may be reduced. Because the second intermediate electrode layer 133-2 formed on the first intermediate electrode layer 133-1 includes a carbon layer containing a relatively high concentration of nitrogen, the surface roughness of the second intermediate electrode layer 133-2 may also be reduced. As a result, the surface roughness of the intermediate electrode layer 133 may be reduced.

In addition, by interposing the first intermediate electrode layer 133-1 including a carbon layer containing a relatively low concentration of nitrogen or a carbon layer containing no nitrogen between the second intermediate electrode layer 133-2 and the selection element layer 132, an increase in the interface resistance between the intermediate electrode layer 133 and the selection element layer 132 may be suppressed. Furthermore, the first intermediate electrode layer 133-1 may prevent nitrogen of the second intermediate electrode layer 133-2 from diffusing into the selection element layer 132.

A nitrogen content of the second intermediate electrode layer 133-2 may be in a range of 3 at % to 10 at %, and a nitrogen content of the first intermediate electrode layer 133-1 may be in a range of 0 at % to 3 at %. In addition, the thickness T3 of the first intermediate electrode layer 133-1 may be in a range of 30 Å to 50 Å.

The intermediate electrode layer 133 may have a symmetrical structure with the lower electrode layer 131 with respect to the selection element layer 132 interposed therebetween.

The variable resistance layer 135 may be an element that stores data in the memory cell 130. To this end, the variable resistance layer 135 may have a variable resistance characteristic of switching between different resistance states according to an applied voltage or current. The variable resistance layer 135 may have a single-layered structure or a multi-layered structure including at least one of materials used for an RRAM, a PRAM, an MRAM, an FRAM, and the like. That is, the variable resistance layer 135 may include a metal oxide such as a perovskite-based oxide, a transition metal oxide, or the like, a phase change material such as a chalcogenide-based material, a ferromagnetic material, a ferroelectric material, or the like.

In an embodiment, the variable resistance layer 135 may include a phase change material that switches between an amorphous state and a crystalline state by Joule's heat generated according to a current flowing therethrough. When the phase change material is in the amorphous state, the phase change material may be in a relatively high resistance state, and when the phase change material is in the crystalline state, the phase change material may be in a relatively low resistance state. Data may be stored in the variable resistance layer 135 using the difference in resistance of the phase change material.

When the intermediate electrode layer 133 includes a carbon layer, the first interface electrode layer 134 interposed between the intermediate electrode layer 133 and the variable resistance layer 135 may increase adhesion while reducing a contact resistance between the intermediate electrode layer 133 and the variable resistance layer 135. In particular, the first interface electrode layer 134 may lower a set voltage applied during a set operation in which the variable resistance layer 135 changes from a high resistance state to a low resistance state. The first interface electrode layer 134 may include a conductive material having a lower resistance than the intermediate electrode layer 133 and having a good adhesive property. For example, the first interface electrode layer 134 may include a metal such as tungsten (W), lithium (Li), aluminum (Al), tin (Sn), bismuth (Bi), antimony (Sb), nickel (Ni), copper (Cu), titanium (Ti), vanadium (V), chromium (Cr), manganese (Mn), iron (Fe), cobalt (Co), zinc (Zn), molybdenum (Mo), or the like.

The upper electrode layer 137 may be interposed between the variable resistance layer 135 and the second line 120, and may electrically connect the variable resistance layer 135 and the second line 120 while physically separating them from each other. The upper electrode layer 137 may include one or more of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the upper electrode layer 137 may include a carbon layer to which a dopant such as nitrogen is added or a carbon layer to which a dopant is not added. The upper electrode layer 137 may have a different material or structure from the lower electrode layer 131 and/or the intermediate electrode layer 133.

When the upper electrode layer 137 includes a carbon layer, the second interface electrode layer 136 interposed between the upper electrode layer 137 and the variable resistance layer 135 may increase adhesion while reducing a contact resistance between the upper electrode layer 137 and the variable resistance layer 135. In particular, the second interface electrode layer 136 may lower the set voltage applied during the set operation in which the variable resistance layer 135 changes from the high resistance state to the low resistance state. The second interface electrode layer 136 may include a conductive material having a lower resistance than the upper electrode layer 137 and having a good adhesive property. For example, the second interface electrode layer 136 may include a metal such as tungsten (W), lithium (Li), aluminum (Al), tin (Sn), bismuth (Bi), antimony (Sb), nickel (Ni), copper (Cu), titanium (Ti), vanadium (V), chromium (Cr), manganese (Mn), iron (Fe), cobalt (Co), zinc (Zn), molybdenum (Mo), or the like.

The layered structure of the memory cell 130 described above may be variously modified on the assumption that the variable resistance layer 135 for data storage is included.

In an embodiment, one of the lower electrode layer 131 and the intermediate electrode layer 133 may include a conductive material, for example, a metal such as platinum (Pt), tungsten (W), aluminum (Al), copper (Cu), or tantalum (Ta), a metal nitride such as titanium nitride (TiN) or tantalum nitride (TaN), or a combination thereof, instead of a carbon layer. In another embodiment, one of the lower electrode layer 131 and the intermediate electrode layer 133 may be omitted.

In still another embodiment, at least one of the first interface electrode layer 134, the second interface electrode layer 136, and the upper electrode layer 137 may be omitted.

In still another embodiment, the memory cell 130 may further include one or more layers for improving characteristics of the memory cell 130 in addition to the layers 131 to 137 described above.

In still another embodiment, the positions of the selection element layer 132 and the variable resistance layer 135 may be reversed from each other. In this case, the relative positions/structures of the lower electrode layer 131, the intermediate electrode layer 133, the first and second interface electrode layers 134 and 136, and the upper electrode layer 137 may also be modified. This will be described in more detail with reference to FIGS. 4 to 6.

Spaces between the first lines 110, spaces between the second lines 120, and spaces between the memory cells 130 may be filled with an insulating material (not shown).

According to the semiconductor memory described above, by optimizing the structures of the lower electrode layer 131 and the intermediate electrode layer 133 respectively positioned below and above the selection element layer 132, it may be possible to improve operating characteristics of the memory cell 130, e.g., it is possible to decrease a level of an operating voltage or increase uniformity of the operating voltage.

Meanwhile, a method of fabricating the semiconductor memory according to the present embodiment will be briefly described as follows.

First, a conductive layer for forming the first lines 110 and material layers for forming the memory cells 130 may be sequentially formed over the substrate 100. In particular, a layer for forming the lower electrode layer 131 may be formed by depositing a first carbon layer having a relatively high nitrogen content over the conductive layer and depositing a second carbon layer having a relatively low nitrogen content or containing no nitrogen over the first carbon layer. For example, each of the first and second carbon layers may be formed by a physical vapor deposition (PVD) method. More specifically, the first carbon layer may be formed by flowing a nitrogen gas into a deposition chamber provided with a carbon source, and then, the second carbon layer may be formed by reducing a flow rate and a flow time of the nitrogen gas or blocking the nitrogen gas. However, embodiments are not limited thereto. In another embodiment, each of the first and second carbon layers may be formed by any of various deposition methods, e.g., chemical vapor deposition (CVD), atomic layer deposition (ALD), or the like.

Similarly, a layer for forming the intermediate electrode layer 133 may be formed by depositing a third carbon layer having a relatively low concentration of nitrogen or containing no nitrogen over a layer for forming the selection element layer 132, and depositing a fourth carbon layer having a relatively high nitrogen content over the third carbon layer.

Subsequently, the conductive layer for forming the first lines 110 and the material layers for forming the memory cells 130 may be etched using a line-shaped mask pattern extending in the first direction. As a result, stacked structures may be formed over the substrate 100. Each of the stacked structures may include the first line 110 and material layer patterns for forming the memory cells 130 having a shape overlapping the first line 110 and disposed over the first line 110. Spaces between the stacked structures may be filled with an insulating material.

Subsequently, a conductive layer for forming the second lines 120 may be formed over the stacked structures and the insulating material filling the spaces between the stacked structures.

Subsequently, the conductive layer for forming the second lines 120 and the stacked structures may be etched using a line-shaped mask pattern extending in the second direction, thereby forming the second lines 120 and the memory cells 130.

Figure 2:
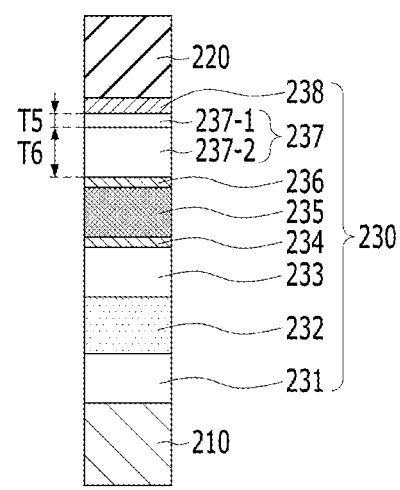
FIG. 2 illustrates a semiconductor memory according to a second embodiment of the present disclosure.

FIG. 2 illustrates a semiconductor memory according to a second embodiment of the present disclosure. For illustrative convenience, FIG. 2 illustrates only one memory cell and portions of upper and lower lines thereof, but as described with reference to FIGS. 1A and 1B, a plurality of memory cells may be arranged between lower lines and upper lines crossing the lower lines. The second embodiment illustrated in FIG. 2 will be described focusing on differences from the above-described first embodiment illustrated in FIG. 1B.

Referring to FIG. 2, a memory cell 230 may be disposed between a first line 210 and a second line 220.

The memory cell 230 may include a stacked structure of a lower electrode layer 231, a selection element layer 232, an intermediate electrode layer 233, a variable resistance layer 235, and an upper electrode layer 237. Further, the memory cell 230 may include a first interface electrode layer 234 between the variable resistance layer 235 and the intermediate electrode layer 233, and a second interface electrode layer 236 between the variable resistance layer 235 and the upper electrode layer 237. Further, the memory cell 230 may include a resistance layer 238 between the upper electrode layer 237 and the second line 220.

The lower electrode layer 231 and/or the intermediate electrode layer 233 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the lower electrode layer 231 and/or the intermediate electrode layer 233 may include a carbon layer to which a dopant such as nitrogen is added or to which a dopant is not added.

The selection element layer 232, the first interface electrode layer 234, the variable resistance layer 235, and the second interface electrode layer 236 may be substantially the same as the selection element layer 132, the first interface electrode layer 134, the variable resistance layer 135, and the second interface electrode layer 136, respectively, shown in FIG. 1B.

The upper electrode layer 237 may include a stacked structure of a first upper electrode layer 237-1 and a second upper electrode layer 237-2. The second upper electrode layer 237-2 may include a carbon layer containing a relatively high concentration of nitrogen, and the first upper electrode layer 237-1 may include a carbon layer containing a relatively low concentration of nitrogen or containing no nitrogen. Therefore, the concentration of nitrogen in the carbon layer of the second upper electrode layer 237-2 is higher than the concentration of nitrogen in the carbon layer of the first upper electrode layer 237-1. The first upper electrode layer 237-1 may be interposed between the second upper electrode layer 237-2 and the resistance layer 238. Furthermore, a thickness T5 of the first upper electrode layer 237-1 may be smaller than a thickness T6 of the second upper electrode layer 237-2.

According to the present embodiment, both a surface roughness of the upper electrode layer 237 and an increase in an interface resistance between the upper electrode layer 237 and the resistance layer 238 may be alleviated. In particular, as will be described later, the resistance layer 238 may prevent an excessive current from flowing through the memory cell 230, and may have a relatively high resistance. Therefore, when the interface resistance between the resistance layer 238 and the upper electrode layer 237 is increased by forming the upper electrode layer 237 to have the stacked structure of the first upper electrode layer 237-1 and the second upper electrode layer 237-2, in addition to the formation of the resistance layer 238 having the relatively high resistance, an operating voltage of the memory cell 230 may increase significantly. To prevent this, the first upper electrode layer 237-1 rather than the second upper electrode layer 237-2 may be disposed adjacent to the resistance layer 238. That is, the first upper electrode layer 237-1 is disposed between the second upper electrode layer 237-2 and the resistance layer 238.

The nitrogen content of the second upper electrode layer 237-2 may be in a range of 3 at % to 10 at %, and the nitrogen content of the first upper electrode layer 237-1 may be in a range of 0 at % to 3 at %. In addition, the thickness T5 of the first upper electrode layer 237-1 may be in a range of 30 Å to 50 Å.

When a large amount of current is supplied to drive the memory cell 230, the resistance layer 238 may prevent an operation failure of the memory cell 230 due to an overshooting current or a spike current flowing through the memory cell 230. The resistance layer 238 may include a conductive material having a higher resistance than the lower electrode layer 231, the intermediate electrode layer 233, and the upper electrode layer 237. For example, the resistance layer 238 may include tungsten silicon nitride (WSiN). However, embodiments are not limited thereto. In another embodiment, the resistance layer 238 may include an insulating material layer which has a small thickness in a range of several to tens of Å to enable a current to flow between the upper electrode layer 237 and the second line 220 at the operating voltage of the memory cell 230.

According to the present embodiment shown in FIG. 2, by optimizing the structure of the upper electrode layer 237 adjacent to the resistance layer 238, it may be possible to improve operation characteristics of the memory cell 230, e.g., it is possible to decrease the operating voltage of the memory cell 230 and to improve uniformity of the operating voltage.

Figure 3:
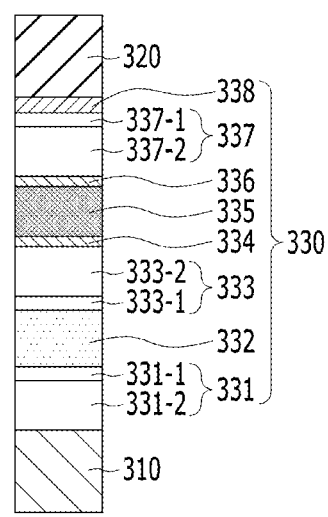
FIG. 3 illustrates a semiconductor memory according to a third embodiment of the present disclosure.

FIG. 3 illustrates a semiconductor memory according to a third embodiment of the present disclosure. It will be described focusing on differences from the above-described embodiments illustrated in FIGS. 1B and 2.

Referring to FIG. 3, a memory cell 330 may be disposed between a first line 310 and a second line 320.

The memory cell 330 may include a stacked structure of a lower electrode layer 331, a selection element layer 332, an intermediate electrode layer 333, a variable resistance layer 335, and an upper electrode layer 337. Further, the memory cell 330 may include a first interface electrode layer 334 between the variable resistance layer 335 and the intermediate electrode layer 333, and a second interface electrode layer 336 between the variable resistance layer 335 and the upper electrode layer 337. Further, the memory cell 330 may include a resistance layer 338 between the upper electrode layer 337 and the second line 320.

The lower electrode layer 331 may be substantially the same as the lower electrode layer 131 of the embodiment of FIG. 1B. That is, the lower electrode layer 331 may include a stacked structure of a first lower electrode layer 331-1 and a second lower electrode layer 331-2. The second lower electrode layer 331-2 may include a carbon layer containing a relatively high concentration of nitrogen, and the first lower electrode layer 331-1 may include a carbon layer containing a relatively low concentration of nitrogen or containing no nitrogen. The first lower electrode layer 331-1 rather than the second lower electrode layer 331-2 may be disposed closer to the selection element layer 332. That is, the first lower electrode layer 331-1 is disposed between the second lower electrode layer 331-2 and the selection element layer 332.

The intermediate electrode layer 333 may be substantially the same as the intermediate electrode layer 133 of the embodiment of FIG. 1B. That is, the intermediate electrode layer 333 may include a stacked structure of a first intermediate electrode layer 333-1 and a second intermediate electrode layer 333-2. The first intermediate electrode layer 333-1 may include a carbon layer containing a relatively low concentration of nitrogen or containing no nitrogen, and the second intermediate electrode layer 333-2 may include a carbon layer containing a relatively high concentration of nitrogen. The first intermediate electrode layer 333-1 rather than the second intermediate electrode layer 333-2 may be disposed closer to the selection element layer 332. That is, the first intermediate electrode layer 333-1 is disposed between the second intermediate electrode layer 333-2 and the selection element layer 332.

The selection element layer 332, the first interface electrode layer 334, the variable resistance layer 335, and the second interface electrode layer 336 may be substantially the same as the selection element layer 132, the first interface electrode layer 134, the variable resistance layer 135, and the second interface electrode layer 136, respectively, shown in FIG. 1B.

The upper electrode layer 337 may be substantially the same as the upper electrode layer 237 shown in FIG. 2. That is, the upper electrode layer 337 may include a stacked structure of a first upper electrode layer 337-1 and a second upper electrode layer 337-2. The second upper electrode layer 337-2 may include a carbon layer containing a relatively high concentration of nitrogen, and the first upper electrode layer 337-1 may include a carbon layer containing a relatively low concentration of nitrogen or containing no nitrogen. The first upper electrode layer 337-1 rather than the second upper electrode layer 337-2 may be disposed closer to the resistance layer 338. That is, the first upper electrode layer 337-1 is disposed between the second upper electrode layer 337-2 and the resistance layer 338.

The resistance layer 338 may be substantially the same as the resistance layer 238 of the embodiment of FIG. 2.

According to the present embodiment shown in FIG. 3, by optimizing the structures of the lower electrode layer 331 and the intermediate electrode layer 333 respectively positioned below and above the selection element layer 332, and by optimizing the structure of the upper electrode layer 337 adjacent to the resistance layer 338, it may be possible to improve operating characteristics of the memory cell 330.

Figure 4:
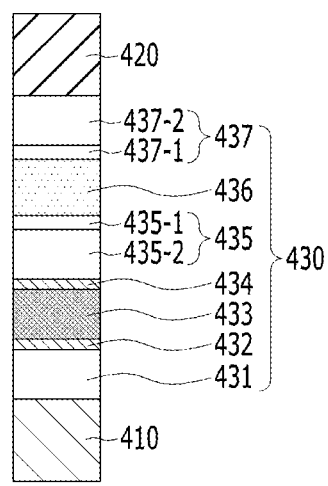
FIG. 4 illustrates a semiconductor memory according to a fourth embodiment of the present disclosure.

FIG. 4 illustrates a semiconductor memory according to a fourth embodiment of the present disclosure. It will be described focusing on differences from the above-described embodiments illustrated in FIGS. 1B, 2, and 3.

Referring to FIG. 4, a memory cell 430 may be disposed between a first line 410 and a second line 420.

The memory cell 430 may include a stacked structure of a lower electrode layer 431, a variable resistance layer 433, an intermediate electrode layer 435, a selection element layer 436, and an upper electrode layer 437. Further, the memory cell 430 may include a first interface electrode layer 432 between the variable resistance layer 433 and the lower electrode layer 431, and a second interface electrode layer 434 between the variable resistance layer 433 and the intermediate electrode layer 435.

The lower electrode layer 431 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the lower electrode layer 431 may include a carbon layer to which a dopant such as nitrogen is added or to which a dopant is not added.

The first interface electrode layer 432, the variable resistance layer 433, and the second interface electrode layer 434 may be substantially the same as the first interface electrode layer, the variable resistance layer, and the second interface electrode layer of any one of the embodiments of FIGS. 1B, 2, and 3 described above.

The intermediate electrode layer 435 may include a stacked structure of a first intermediate electrode layer 435-1 and a second intermediate electrode layer 435-2. The second intermediate electrode layer 435-2 may include a carbon layer containing a relatively high concentration of nitrogen, and the first intermediate electrode layer 435-1 may include a carbon layer containing a relatively low concentration of nitrogen or containing no nitrogen. The first intermediate electrode layer 435-1 rather than the second intermediate electrode layer 435-2 may be disposed adjacent to the selection element layer 436. That is, the first intermediate electrode layer 435-1 is disposed between the second intermediate electrode layer 435-2 and the selection element layer 436.

The selection element layer 436 may be substantially the same as the selection element layer of any one of the embodiments of FIGS. 1B, 2, and 3 described above.

The upper electrode layer 437 may include a stacked structure of a first upper electrode layer 437-1 and a second upper electrode layer 437-2. The first upper electrode layer 437-1 may include a carbon layer containing a relatively low concentration of nitrogen or containing no nitrogen, and the second upper electrode layer 437-2 may include a carbon layer containing a relatively high concentration of nitrogen. The first upper electrode layer 437-1 rather than the second upper electrode layer 437-2 may be disposed adjacent to the selection element layer 436. That is, the first upper electrode layer 437-1 is disposed between the second upper electrode layer 437-2 and the selection element layer 436.

The structure of the memory cell 430 may correspond to a structure in which positions of the material layers constituting the memory cell 130 of FIG. 1B are reversed between the first line 110 and the second line 120.

According to the present embodiment, by optimizing the structures of the intermediate electrode layer 435 and the upper electrode layer 437 respectively positioned below and above the selection element layer 436, operating characteristics of the memory cell 430 may be improved.

Figure 5:
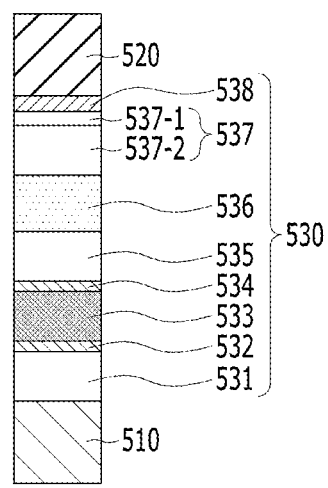
FIG. 5 illustrates a semiconductor memory according to a fifth embodiment of the present disclosure.

FIG. 5 illustrates a semiconductor memory according to a fifth embodiment of the present disclosure. It will be described focusing on differences from the above-described embodiments shown in FIGS. 1B and 2 to 4.

Referring to FIG. 5, a memory cell 530 may be disposed between a first line 510 and a second line 520.

The memory cell 530 may include a stacked structure of a lower electrode layer 531, a variable resistance layer 533, an intermediate electrode layer 535, a selection element layer 536, and an upper electrode layer 537. Further, the memory cell 530 may include a first interface electrode layer 532 between the variable resistance layer 533 and the lower electrode layer 531, and a second interface electrode layer 534 between the variable resistance layer 533 and the intermediate electrode layer 535. Further, the memory cell 530 may include a resistance layer 538 between the upper electrode layer 537 and the second line 520.

The lower electrode layer 531, the first interface electrode layer 532, the variable resistance layer 533, and the second interface electrode layer 534 may be substantially the same as the lower electrode layer 431, the first interface electrode layer 432, the variable resistance layer 433, and the second interface electrode layer 434 of the embodiment of FIG. 4.

The intermediate electrode layer 535 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the intermediate electrode layer 535 may include a carbon layer to which a dopant such as nitrogen is added or to which a dopant is not added.

The selection element layer 536 may be substantially the same as the selection element layer 436 of the embodiment of FIG. 4.

The upper electrode layer 537 may include a stacked structure of a first upper electrode layer 537-1 and a second upper electrode layer 537-2. The second upper electrode layer 537-2 may include a carbon layer containing a relatively high concentration of nitrogen, and the first upper electrode layer 537-1 may include a carbon layer containing a relatively low concentration of nitrogen or containing no nitrogen. The first upper electrode layer 537-1 rather than the second upper electrode layer 537-2 may be disposed adjacent to the resistance layer 538. That is, the first upper electrode layer 537-1 is disposed between the second upper electrode layer 537-2 and the resistance layer 538.

The resistance layer 538 may be substantially the same as the resistance layer of the embodiment of any of FIGS. 2 and 3.

The structure of the memory cell 530 may correspond to a structure in which a position of the selection element layer 232 and positions of the first interface electrode layer 234, the variable resistance layer 235, and the second interface electrode layer 236 shown in FIG. 2 are switched between the first line 210 and the second line 220. According to the present embodiment illustrated in FIG. 5, by optimizing the structure of the upper electrode layer 537 adjacent to the resistance layer 538, operating characteristics of the memory cell 530 may be improved.

Figure 6:
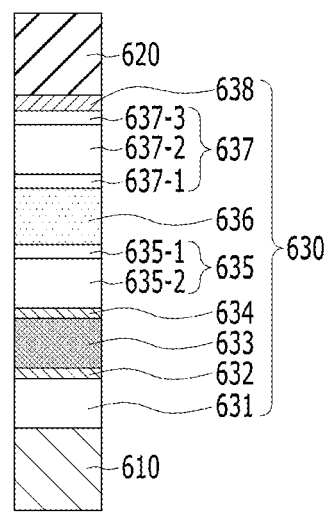
FIG. 6 illustrates a semiconductor memory according to a sixth embodiment of the present disclosure

FIG. 6 illustrates a semiconductor memory according to a sixth embodiment of the present disclosure. It will be described focusing on differences from the above-described embodiments illustrated in FIGS. 1B and 2 to 5.

Referring to FIG. 6, a memory cell 630 may be disposed between a first line 610 and a second line 620.

The memory cell 630 may include a stacked structure of a lower electrode layer 631, a variable resistance layer 633, an intermediate electrode layer 635, a selection element layer 636, and an upper electrode layer 637. Further, the memory cell 630 may include a first interface electrode layer 632 between the variable resistance layer 633 and the lower electrode layer 631, and a second interface electrode layer 634 between the variable resistance layer 633 and the intermediate electrode layer 635. Further, the memory cell 630 may include a resistance layer 638 between the upper electrode layer 637 and the second line 620.

The lower electrode layer 631, the first interface electrode layer 632, the variable resistance layer 633, and the second interface electrode layer 634 may be substantially the same as the lower electrode layer, the first interface electrode layer, the variable resistance layer, and the second interface electrode layer of the embodiment of FIG. 4 or the embodiment of FIG. 5 described above.

The intermediate electrode layer 635 may be substantially the same as the intermediate electrode layer 435 of the embodiment of FIG. 4 described above. That is, the intermediate electrode layer 635 may include a first intermediate electrode layer 635-1 and a second intermediate electrode layer 635-2. The second intermediate electrode layer 635-2 may include a carbon layer containing a relatively high concentration of nitrogen, and the first intermediate electrode layer 635-1 may include a carbon layer containing a relatively low concentration of nitrogen or containing no nitrogen. The first intermediate electrode layer 635-1 rather than the second intermediate electrode layer 635-2 may be disposed adjacent to the selection element layer 636. That is, the first intermediate electrode layer 635-1 is disposed between the second intermediate electrode layer 635-2 and the selection element layer 636.

The selection element layer 636 may be substantially the same as the selection element layer of the embodiment of FIG. 4 or the embodiment of FIG. 5 described above.

The upper electrode layer 637 may include a stacked structure of a first upper electrode layer 637-1, a second upper electrode layer 637-2, and a third upper electrode layer 637-3. The second upper electrode layer 637-2 may include a carbon layer containing a relatively high concentration of nitrogen, and the first and third upper electrode layers 637-1 and 637-3 may include a carbon layer containing a relatively low concentration of nitrogen or containing no nitrogen. The first upper electrode layer 637-1 may be disposed adjacent to the selection element layer 636. The third upper electrode layer 637-3 may be disposed adjacent to the resistance layer 638. The second upper electrode layer 637-2 may be interposed between the first upper electrode layer 637-1 and the third upper electrode layer 637-3. A thickness of the second upper electrode layer 637-2 may be greater than a thickness of the first upper electrode layer 637-1 and a thickness of the third upper electrode layer 637-3.

The resistance layer 638 may be substantially the same as the resistance layer 538 of the embodiment of FIG. 5 described above.

According to the present embodiment illustrated in FIG. 6, by optimizing the structure of the intermediate electrode layer 635 positioned below the selection element layer 636, and the structure of the upper electrode layer 637 positioned between the selection element layer 636 and the resistance layer 638, operating characteristics of the memory cell 630 may be improved.

The above and other memory circuits or semiconductor memory devices based on the disclosed technology can be used in a range of devices or systems. FIGS. 7-10 provide some examples of devices or systems that can implement the semiconductor memory disclosed herein.

Figure 7:
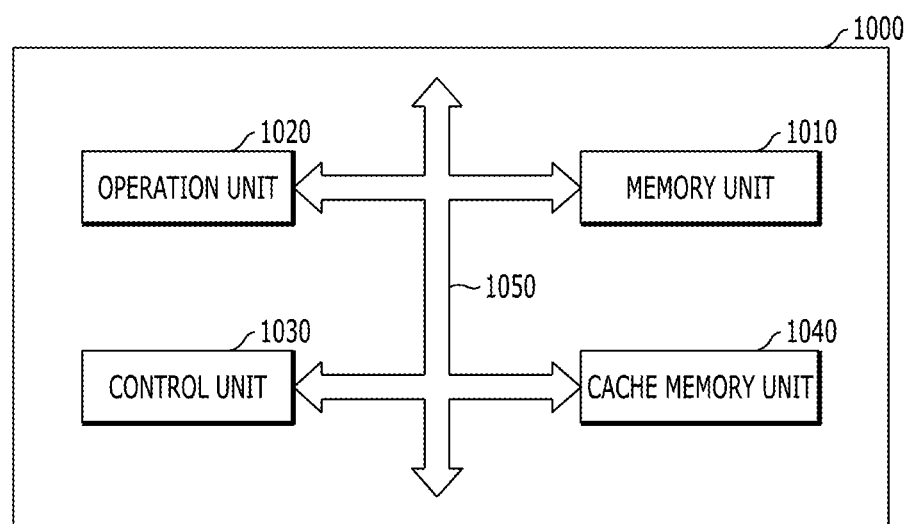
FIG. 7 illustrates a microprocessor including a semiconductor memory based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer. Through this, in the memory unit 101, memory cell characteristics and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
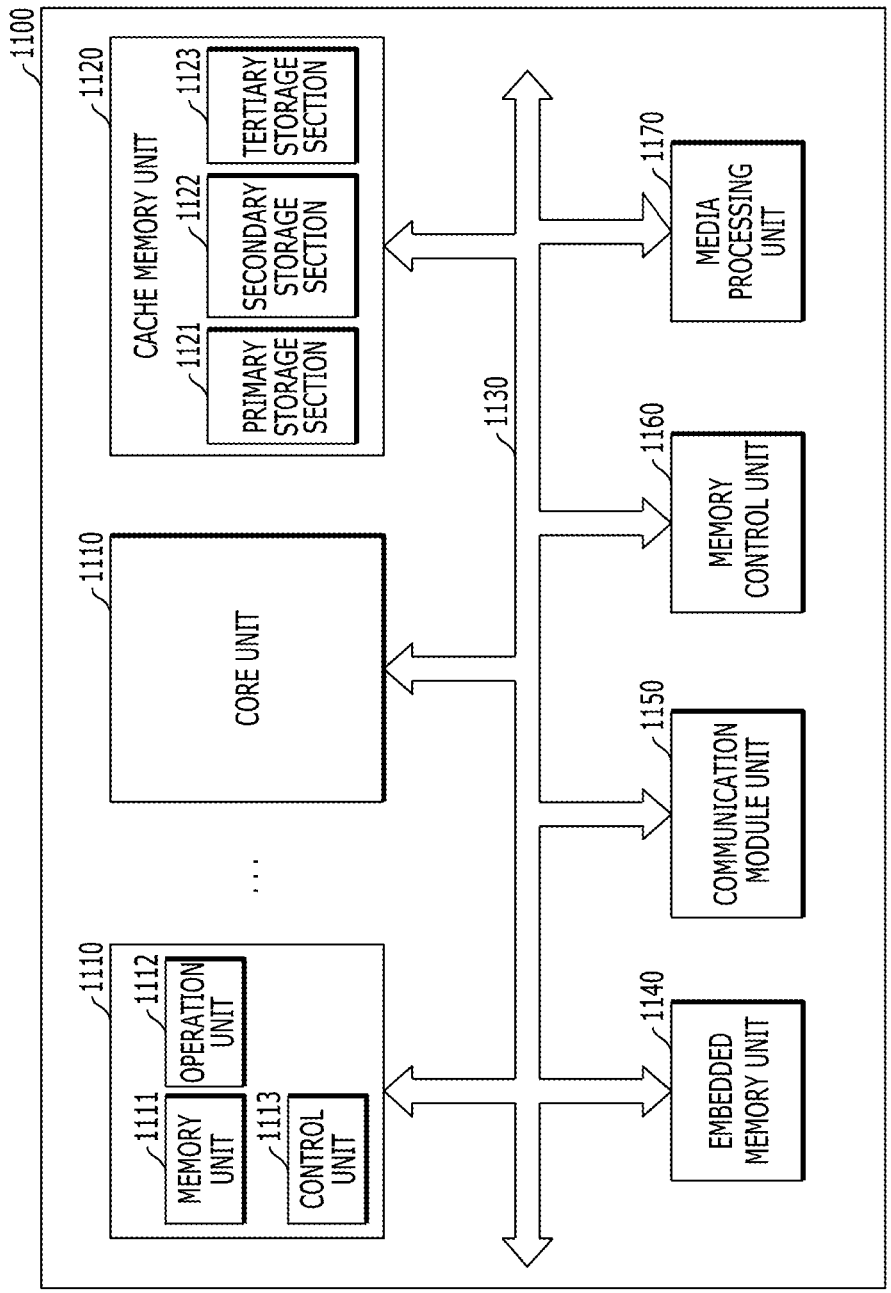
FIG. 8 illustrates a processor including a semiconductor memory based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer. Through this, memory cell characteristics and fabricating processes may be improved in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
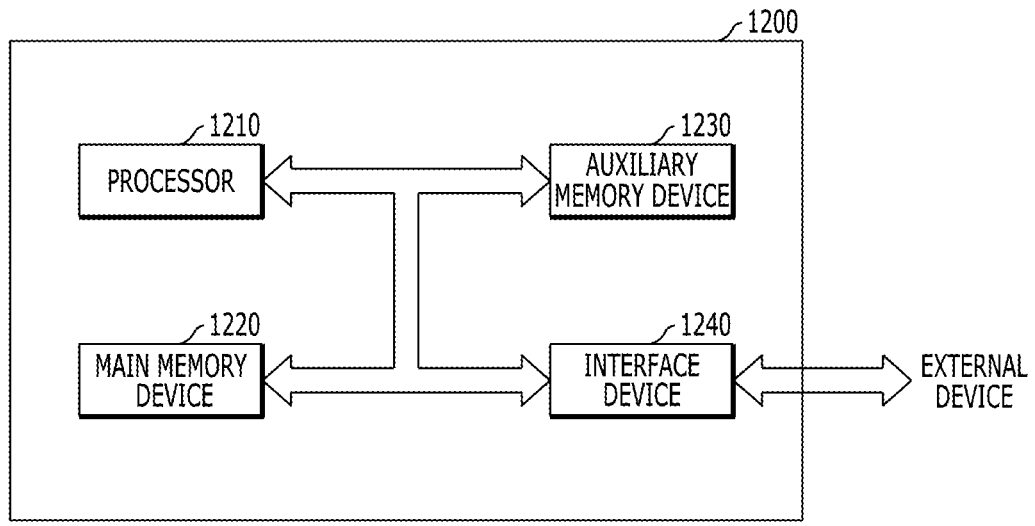
FIG. 9 illustrates a system including a semiconductor memory based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer. Through this, memory cell characteristics and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 10) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 10:
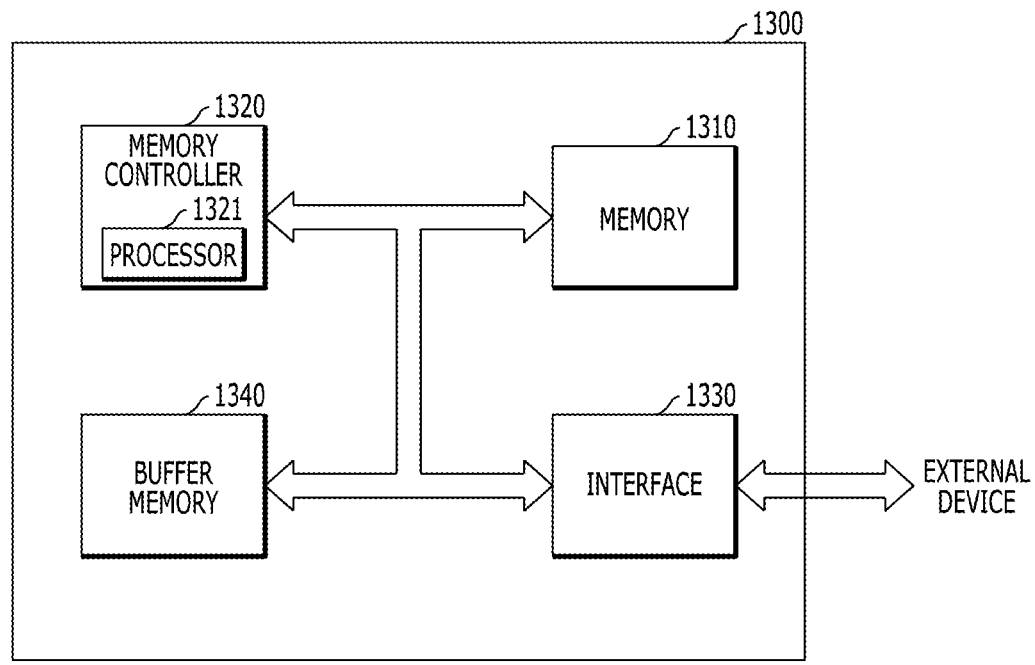
FIG. 10 illustrates a memory system including a semiconductor memory based on the disclosed technology.

FIG. 10 is an example of configuration diagram of a memory system implementing memory circuitry based on the disclosed technology.

Referring to FIG. 10, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a first line; a second line disposed over the first line to be spaced apart from the first line; a variable resistance layer disposed between the first line and the second line; a selection element layer disposed between the first line and the variable resistance layer or between the second line and the variable resistance layer; and one or more electrode layers disposed over or under the selection element layer or disposed over and under the selection element layer, the one or more electrode layers being adjacent to the selection element layer, wherein each of the one or more electrode layers includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer. Through this, in the memory 1310 or the buffer memory 1340, memory cell characteristics and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 7-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

Although various embodiments have been described for illustrative purposes, it will be apparent to those skilled in the art that various changes and modifications may be made without departing from the spirit and scope of the present teachings as defined in the following claims.

What is claimed is:

1. An electronic device comprising a semiconductor memory, the semiconductor memory comprising:
   a first line;
   a second line disposed over the first line to be spaced apart from the first line;
   a variable resistance layer disposed between the first line and the second line;
   a selection element layer disposed between the first line and the variable resistance layer; and
   an electrode layer disposed between the first line and the selection element layer or between the selection element layer and the variable resistance layer,
   wherein the electrode layer includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the selection element layer.

2. The electronic device according to claim 1, wherein a thickness of the first electrode layer is smaller than a thickness of the second electrode layer.

3. The electronic device according to claim 1, wherein a thickness of the first electrode layer is in a range of 30 Å to 50 Å.

4. The electronic device according to claim 1, wherein a nitrogen content of the second electrode layer is in a range of 3 at % to 10 at %.

5. The electronic device according to claim 1, wherein the electrode layer is disposed between the first line and the selection element layer, and
   wherein the semiconductor memory further comprises:
   another electrode layer disposed between the selection element layer and the variable resistance layer,
   wherein the another electrode layer includes a first another electrode layer and a second another electrode layer, the second another electrode layer including a second carbon layer containing nitrogen, the first another electrode layer including a first carbon layer that contains nitrogen having a lower concentration than nitrogen contained in the second carbon layer of the second another electrode layer or contains no nitrogen, the first another electrode layer being interposed between the second another electrode layer and the selection element layer.

6. The electronic device according to claim 5, wherein the electrode layer and the another electrode layer have a symmetrical structure with respect to the selection element layer interposed therebetween.

7. The electronic device according to claim 5, wherein the semiconductor memory further comprises:
   still another electrode layer interposed between the second line and the variable resistance layer; and
   a resistance layer interposed between the still another electrode layer and the second line,
   wherein the still another electrode layer includes a first still another electrode layer and a second still another electrode layer, the second still another electrode layer including a carbon layer containing nitrogen, the first still another electrode layer including a carbon layer that contains nitrogen having a lower concentration than nitrogen contained in the carbon layer of the second still another electrode layer or contains no nitrogen, the first still another electrode layer being interposed between the second still another electrode layer and the resistance layer.

8. The electronic device according to claim 7, wherein a thickness of the first still another electrode layer is smaller than a thickness of the second still another electrode layer.

9. The electronic device according to claim 1, wherein the electrode layer is disposed between the selection element layer and the variable resistance layer, and
   wherein the semiconductor memory further comprises:
   another electrode layer disposed between the first line and the selection element layer,
   wherein the another electrode layer includes a first another electrode layer and a second another electrode layer, the second another electrode layer including a second carbon layer containing nitrogen, the first another electrode layer including a first carbon layer that contains nitrogen having a lower concentration than nitrogen contained in the second carbon layer of the second another electrode layer or contains no nitrogen, the first another electrode layer being interposed between the second another electrode layer and the selection element layer.

10. The electronic device according to claim 9, wherein the electrode layer and the another electrode layer have a symmetrical structure with respect to the selection element layer interposed therebetween.

11. The electronic device according to claim 9, wherein the semiconductor memory further comprises:
    a resistance layer interposed between the another electrode layer and the first line,
    wherein the another electrode layer further includes a third another electrode layer which is interposed between the second another electrode layer and the resistance layer, the third another electrode layer including a carbon layer that contains nitrogen having a lower concentration than nitrogen contained in the second carbon layer of the second another electrode layer or contains no nitrogen.

12. The electronic device according to claim 11, wherein a thickness of the second another electrode layer is greater than a thickness of the first another electrode layer and a thickness of the third another electrode layer.

13. An electronic device comprising a semiconductor memory, the semiconductor memory comprising:
    a first line;
    a second line disposed over the first line to be spaced apart from the first line;
    a variable resistance layer disposed between the first line and the second line;
    a selection element layer disposed between the first line and the variable resistance layer or between the second line and the variable resistance layer;
    an electrode layer disposed under the second line to be adjacent to the second line; and
    a resistance layer disposed between the second line and the electrode layer,
    wherein the electrode layer includes a first electrode layer and a second electrode layer, the second electrode layer including a second carbon layer containing nitrogen, the first electrode layer including a first carbon layer that contains nitrogen having a lower concentration than nitrogen contained in the second carbon layer of the second electrode layer or contains no nitrogen, the first electrode layer being interposed between the second electrode layer and the resistance layer.

14. The electronic device according to claim 13, wherein a thickness of the first electrode layer is smaller than a thickness of the second electrode layer.

15. The electronic device according to claim 13, wherein a thickness of the first electrode layer is in a range of 30 Å to 50 Å.

16. The electronic device according to claim 13, wherein a nitrogen content of the second electrode layer is in a range of 3 at % to 10 at %.

* * * * *